United States Patent
Okubo et al.

[11] Patent Number: 6,157,603
[45] Date of Patent: Dec. 5, 2000

[54] DISK REPRODUCTION APPARATUS CAPABLE OF CONTINUOUSLY VARYING A REPRODUCTION SPEED

[75] Inventors: Mamiko Okubo, Kawasaki; Hiroshi Shimada, Kamakura, both of Japan

[73] Assignee: Kabushiki Kaisha Toshiba, Kawasaki, Japan

[21] Appl. No.: 09/105,170

[22] Filed: Jun. 26, 1998

[30] Foreign Application Priority Data

Jun. 26, 1997  [JP]  Japan .................................. 9-185732

[51] Int. Cl.[7] ........................................................ G11B 7/00
[52] U.S. Cl. ............................ 369/50; 369/124.1; 369/59
[58] Field of Search ................................. 369/59, 54, 53, 369/47, 48, 58, 124.1, 124.05

[56] References Cited

U.S. PATENT DOCUMENTS

| | | | |
|---|---|---|---|
| 5,170,386 | 12/1992 | Tateishi | 369/59 |
| 5,526,339 | 6/1996 | Shimada | 369/59 |
| 5,856,963 | 1/1999 | Inagawa et al. | 369/59 |
| 5,974,088 | 10/1999 | Chang | 369/59 |
| 5,982,724 | 11/1999 | Hayashi et al. | 369/50 |

*Primary Examiner*—Nabil Hindi
*Attorney, Agent, or Firm*—Oblon, Spivak, McClelland, Maier & Neustadt, P.C.

[57] ABSTRACT

A data slice circuit which generates a EFM signal from a RF signal includes a clock signal generator circuit for generating a clock signal not synchronized with the EFM signal. The data slice circuit divides a clock signal not synchronized with the EFM signal, by a divider, to generate a clock signal for counting. The clock signal for counting is inputted as a clock into an up/down counter. Up/down count control of the up/down counter is performed on the basis of an output from a comparator. The comparator compares the RF signal with a reference voltage and outputs data "1" or "0" in accordance with the comparison result. A count output of the up/down counter is converted into an analog voltage by a digital/analog converter and is supplied as a reference voltage to the comparator.

20 Claims, 3 Drawing Sheets

DISK REPRODUCTION APPARATUS CAPABLE OF CONTINUOUSLY VARYING A REPRODUCTION SPEED

BACKGROUND OF THE INVENTION

1. Field of the Invention

The present invention relates to a disk reproduction apparatus for an optical disk such as a compact disk (CD), a digital versatile disk (DVD), or the like, and particularly, to a data slice circuit for a reproduction apparatus capable of sequentially varying its reproduction speed.

2. Discussion of the Background

In the field of audio devices, developments are presently made for a digital recording/reproducing system. Since this system performs recording/reproducing at a high density with a high fidelity, audio signals are converted into digital signals by means of a PCM (Pulse Code Modulation) technique, which are recorded on a recording medium such as a disk or a magnetic tape and are also reproduced. Particularly, in case of a CD which is widely used now, bit columns corresponding to digital data are formed on a disk having a diameter of 12 cm.

In the CD, digital data (main information data) obtained by PCM-encoding analog audio signals in units of 16-bit is recorded. The digital data is recorded in a manner of repeating frames, on condition that eight bits constitute one symbol and twenty four symbols constitute one frame. In the CD, a CIRC (Cross Interleave Reed-Solomon Code) is used as an error correction code.

Specifically, digital data consisting of 24 symbols is supplied to a C2-sequence parity generator circuit and parity data consisting of 4 symbols Q for correcting a C2-sequence error is generated. The digital data and the parity symbol Q are supplied to a C1-sequence parity generator circuit through an interleave circuit, and parity symbol P consisting of 4 symbols for correcting a C1-sequence error is generated. Data of 32 symbols consisting of the data of 24 symbols, the parity symbol P of 4 symbols, and the parity symbol Q of 4 symbols is added with sub-code data of 8-bit (consisting of one symbol). The sub-code data and the data of 32 symbols are subjected to EFM (Eight Fourteen Modulation). Margins of 3-bit are added between these symbols each being of 14-bit, and further, a frame synchronization data of 24-bit is added to the top. Thus, data of 588-bit is recorded as one frame onto a disk. In this case, since the bit clock is 4.32 MHz, data is recorded onto a disk at 136 μsec (7.35 KHz) per frame. As for sub-code data, one sub-code frame consists of 98 frames, and sub-code data is recorded onto a disk at 75 Hz (10.3 msec) per sub-code frame.

In a disk reproduction apparatus for reproducing data from a CD, a CD is rotated at a constant linear velocity (CLV) by a motor control circuit and a motor. An example of this kind of disk reproduction apparatus which has been conventionally known is an apparatus described in U.S. Pat. No. 5,526,339 by the same assignor as the present invention.

The conventional disk reproduction apparatus disclosed in the patent is provided with an optical pickup element including a semiconductor laser, a photoelectric transducer, and the like. The optical pickup element reads data recorded on a CD, by linearly tracking the disk being rotated by a disk motor, from the inner circumferential side to the outer circumferential side. The data (or a current signal) thus read is supplied to an amplifier. The amplifier converts the current signal into a signal of a wide range as a voltage signal (which will hereinafter referred to as an RF signal) and supplies the converted signal to a data slice circuit. The data slice circuit binarizes a reproduction signal and supplies the signal as a EFM signal to a PLL (Phase Locked Loop) circuit and a data processing circuit. The data processing circuit separates a synchronization signal from the EFM signal, and thereafter, performs EFM demodulation, to separates therefrom a subcode data component and a data component of 32 symbols including parity symbol P and parity symbol Q. Subsequently, the data thus EFM-demodulated is written into a memory by a clock signal generated from the PLL circuit. The data thus written into the memory is read from the memory by a system reference clock signal of a constant frequency generated with use of a quartz oscillator, thereby to absorb a change of time axis caused due to the motor. The data thus read from the memory is subjected to error correction, and is thereafter outputted as digital data of 16-bit.

Change of the reproduction speed is carried out by a system controller. The system controller generates a reproduction speed control signal (which will be hereinafter referred to as a HS). The HS signal instructs, for example, a normal reproduction speed (1×-speed), or a twice higher speed than a reference speed (2×-speed). The HS signal is supplied to the data processing circuit and the motor control circuit, and the processing speed and the disk reproduction speed are switched to aimed velocities. Also, the HS signal is supplied to the data slice circuit, and the data slice circuit changes the control frequency range so as to correspond to the reproduction speed, in response to the HS signal.

The data slice circuit compares the RF signal with the reference voltage, and converts the RF signal into binary data (a binarized signal), e.g., a EFM signal. An up/down counter counts a period of binarized data "0" and a period of data "1", and outputs differential data therebetween.

A count clock of the up/down counter is a clock signal generated by a PLL circuit, based on a EFM signal. The clock signal is synchronized with the reproduction speed of data.

The differential data outputted from the up/down counter is supplied to a digital/analog converter. The digital/analog converter converts the differential data into an analogue voltage and feeds back the analog voltage as a reference voltage described above, to a comparator. The comparator binarizes a RF signal by the reference voltage thus fed back, thereby to control the period of "0" to be equal to the period of data "1".

The data slice circuit thus feeds back a count result so that the period of data "0" is equal to the period of data "1".

If the frequency range in the feed-back loop described above is too low, the slice level cannot follow a change of an amplitude of the RF signal when the amplitude of the RF signal changes. Inversely, if the frequency range is too high, the slice level changes following the amplitude of the RF signal having a very small slice level if the frequency range is too high, the EFM signal after slice increases jitters.

From the reasons describe above, frequency range setting must be carried out for a data slice circuit. However, in a conventional data slice circuit, it is difficult to design a frequency range for one single data slice circuit itself since the EFM signal and the clock signal inputted to the up/down counter are synchronized with each other.

BRIEF SUMMARY OF THE INVENTION

Therefore, the present invention has an object of providing a disk reproduction apparatus in which the frequency of a clock signal used in a data slice circuit is made follow the reproduction rate of a EFM signal while the phase is not synchronized with the EFM signal, so that it is easy to design a frequency range for one single data slice circuit itself.

According to the present invention, there is provided a disk reproduction apparatus comprising: a photoelectric transducer for optically reading data recorded on a disk and for converting the data into an electric signal; an amplifier for amplifying the electric signal supplied from the photoelectric transducer; a data slice circuit for binarizing the electric signal supplied from the amplifier, to generate a modulated signal; a PLL circuit for generating a first clock signal and a frequency control signal in accordance with a change of a reproduction speed of data, based on the modulated signal supplied from the data slice circuit; and a data processing circuit for demodulating the modulated signal supplied from the data slice circuit, based on the first clock signal supplied from the PLL circuit, to reproduce data, wherein the data slice circuit includes a clock signal generator circuit for generating a second clock signal not synchronized with the modulated signal, based on the frequency control signal generated by the PLL circuit, a comparator for comparing the electric signal supplied from the amplifier with a reference voltage, to output one of data items "0" and "1", in correspondence with the electric signal and the reference voltage, a first divider for dividing the second clock signal, a to generate a first integration reference clock signal, a differential data calculator for integrating a differential value between a period of the data item "0" and a period of the data item "1" supplied based on the first integration reference clock signal, and outputs a differential data, and a digital/analog converter supplied with the differential data outputted from the differential data calculator, for converting the differential data into an analog voltage, and for supplying the analog voltage as the reference voltage to the comparator.

According to the present invention, there is provided a signal processing circuit used for reading disk data from a disk and for converting the disk data into an amplified electric signal, comprising: a data slice circuit for binarizing the amplified electric signal, to generate a modulated signal; and a PLL circuit for generating a PLL clock signal and a frequency control signal in accordance with a change of a reproduction speed of data, based on the modulated signal supplied from the data slice circuit, wherein the data slice circuit includes a clock signal generator circuit for generating a clock signal not synchronized with the modulated signal, based on the frequency control signal generated by the PLL circuit, a comparator for comparing the amplified electric signal with a reference voltage, to output one of data items "0" and "1", in correspondence with the amplified electric signal and the reference voltage, a first divider for dividing the clock signal, to generate a first integration reference clock signal, a differential data calculator for integrating a differential value between a period of the data item "0" and a period of the data item "1" supplied from the comparator, based on the first integration reference clock signal and outputs a differential data, and a digital/analog converter supplied with the differential data outputted from the differential data calculator, for converting the differential data into an analog voltage, and for supplying the analog voltage as the reference voltage to the comparator, so that the data slice circuit binarizes the amplified electric signal, in accordance with the change of the reproduction speed of the data.

The data slice circuit according to the present invention binarizes an electric signal supplied from a photoelectric transducer, to generate a binarized signal such as an EFM signal or the like. A frequency control signal is generated by a PLL circuit, on the basis of an EFM signal supplied from the data slice circuit. The frequency control signal is supplied to a clock signal generator circuit and a clock signal for an up/down counter is generated. In this manner, the frequency of an up/down counter sequentially follows the reproduction rate of the EFM signal, and the phase is not synchronized with the EFM signal. Therefore, the control range of the reference voltage for slicing an RF signal generated with use of differential data outputted from the up/down counter can be sequentially changed in compliance with the reproduction speed, and the range design of the data slice circuit can be solely achieved, separated from the PLL circuit.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

In the following, embodiments of the present invention will be explained with reference to the drawings.

Figure 1:
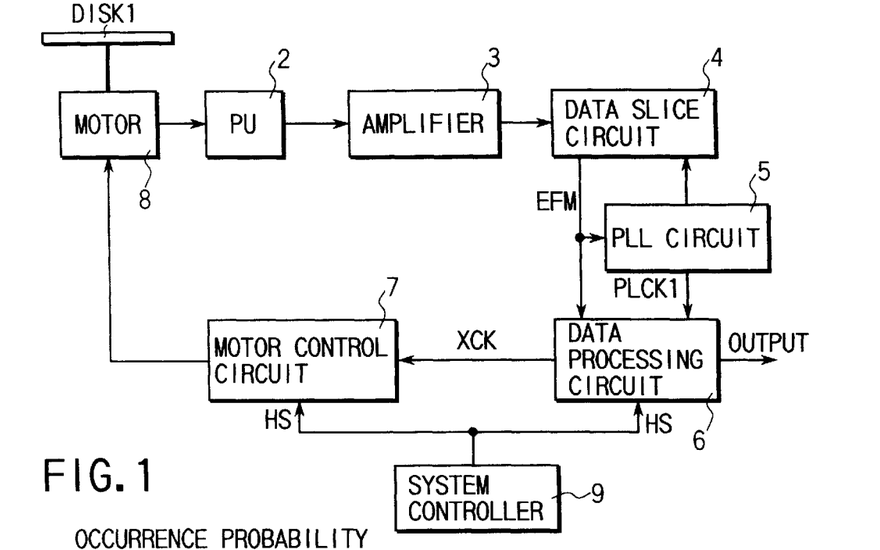
FIG. 1 is a block diagram showing the entire structure of a disk reproduction apparatus according to the present invention.

In FIG. 1, an optical pickup element (PU) 2 including a semiconductor laser, a photoelectric transducer, and the like reads data recorded on a disk 1, by linear-tracking the disk 1 being rotated by a disk motor 8 in a direction from the inner circumferential side of the disk 1 to the outer circumferential side thereof. The data (or a current signal) thus read out is supplied to an amplifier 3. The amplifier 3 converts the current signal into a signal of a wide range as a voltage signal (which will be hereinafter referred to as a RF signal), and supplies the signal to a data slice circuit 4. The data slice circuit 4 binarizes a reproduction signal and supplies the binarized signal as a EFM signal to a PLL (Phase Locked Loop) circuit 5 and a data processing circuit 6. The data processing circuit 6 separates a synchronization signal from the EFM signal and thereafter performs EFM-demodulation, so that the EFM signal is separated into a sub-code data component and a data component of 32 symbols including parity symbol P and parity symbol Q. Subsequently, the data thus subjected to EFM-demodulation is written into a memory by a clock signal PLCK1 generated by a PLL circuit 5. The data thus written into the memory is read out from the memory by a system reference clock signal XCK generated with use of a quartz oscillator and having a stable frequency, thereby to absorb a change of the time-axis caused due to the motor. The data thus read out from the memory is subjected to error correction and is thereafter outputted as digital data of 16-bit.

Change of the reproduction speed is carried out by a system controller 9. The system controller 9 generates a reproduction speed control signal (which is hereinafter referred to as HS). The HS signal instructs, for example, a normal reproduction speed (1×-speed), a twice higher speed than a reference speed (2×-speed), or a speed up to 32 times higher speed (32×-speed). The HS signal is supplied to a data processing circuit 6 and a motor control circuit 7. The processing speed and the disk reproduction speed are switched to aimed velocities. The HS signal is also supplied to the data slice circuit 4. The data slice circuit 4 changes the control frequency range so as to corresponding to the reproduction speed in accordance with the HS signal.

Figure 2:
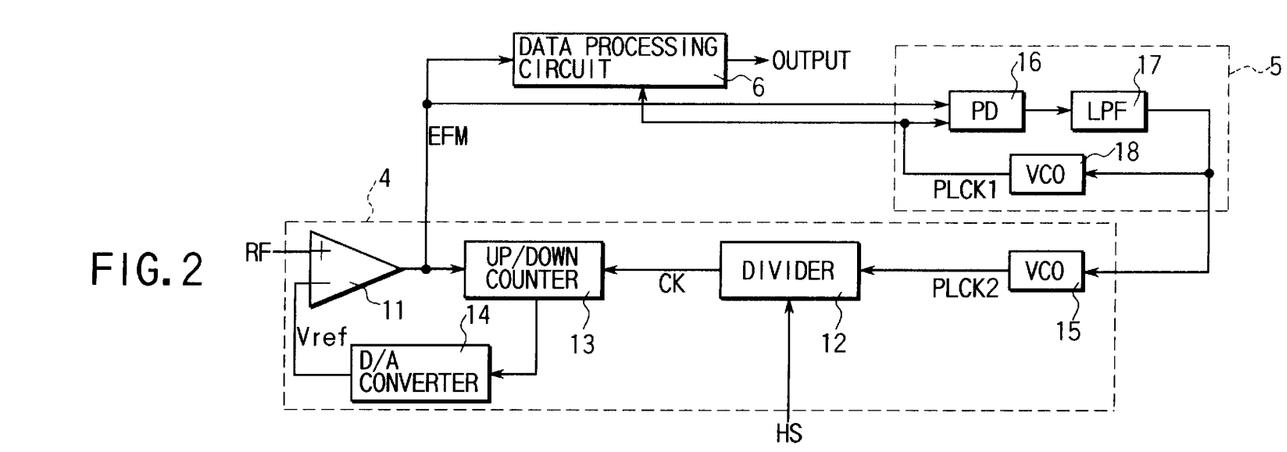
FIG. 2 is a block diagram showing the structure of a main part of a disk reproduction apparatus according to a first embodiment of the present invention.

In the first embodiment shown in FIG. 2, the data slice circuit 4 comprises a comparator 11, a divider 12, an up/down counter 13, a digital/analog converter 14, and a voltage controlled oscillator (VCO) 15. The comparator 11 compares a RF signal supplied from the amplifier 3 with a reference voltage Vref, and outputs one of data "0" and data "1" in accordance with the RF signal and the reference voltage Vref. The divider 12 divides a clock signal to generate a clock signal CK used for counting (e.g., an integration reference signal). The up/down counter 13 serves as a differential data calculator which integrates a differential value between the period of data "0" and the period of data "1" supplied from the comparator 11, based on the clock signal for counting, supplied from the divider 12, and outputs a differential data. The digital/analog converter 14 is supplied with the differential data outputted from the up/down counter, converts the differential data into an analog voltage, an supplies the differential data as a reference voltage described above to the comparator 11. The voltage controlled oscillator (VCO) 15 is inputted with a frequency control signal described later, outputted from a PLL circuit 5.

The RF signal is supplied to a non-inverted input end of the comparator 11, and the reference voltage Vref is supplied to an inverted input end of the comparator 11. The comparator 11 compares the RF signal with the reference voltage Vref, and converts the RF signal into binary data of "0" or "1". An output end of the comparator 11 is connected to an up/down control terminal of the up/down counter 13. The up/down counter 13 is supplied with a clock signal CK for counting. In the up/down counter 13, an integration gain of a difference between the period of the data "0" and the period of the data "1", using the clock signal CK as an integration reference signal. Specifically, the up/down counter 13 counts down the clock signal when data "0" is supplied from the comparator 11, and counts up the clock signal when data "1" is supplied from the comparator 11. Therefore, differential data between the period of data "0" and the period of data "1" is outputted from the up/down counter 13, in correspondence with the period of the data "0" and the period of data "1" outputted from the comparator 11. The differential data is converted into an analog voltage in a D/A converter 14. The analog voltage thus converted is fed back as a reference voltage Vref to the comparator 11. This feed-back controls the period of data "0" to be equal to the period of data "1". The data "0" and the data "1" constitute a EFM signal. That is, the data slice circuit 4 binarizes the RF signal and supplies a binarized signal such as a EFM signal or the like to the PLL circuit 5 and the data processing circuit 6.

The PLL circuit 5 comprises a phase comparator (PD) 16 supplied with the EFM signal, a low-pass filter circuit (LPF) 17 supplied with an output from the phase comparator 16, and a voltage controlled oscillator (VCO) 18 which is inputted with an output of the low-pass filter circuit 17 and supplies an output to the phase comparator 16.

The PLL circuit 5 generates a first clock signal PLCK1 synchronized with the EFM signal. When the first clock signal PLCK1 is synchronized with the RF signal, the frequency of the clock signal PLCK1 is proportional to the reproduction speed. A frequency control signal outputted from the low-pass filter circuit 17 constituting the PLL circuit 5 is inputted to the voltage controlled oscillator (VCO) 15 in the data slice circuit 4. Based on the frequency control signal, a second clock signal PLCK2 is generated in the voltage controlled oscillator 15. Therefore, the voltage controlled oscillator 15 is used as a clock signal generator circuit and constitutes the data slice circuit 4.

The second clock signal PLCK2 follows the reproduction speed but is not synchronized with the EFM signal. The clock signal CK supplied to the up/down counter 13 of the data slice circuit 4 is a signal generated by dividing the second clock signal PLCK2 by N in the divider 12. As the divider 12, a programmable divider is used in which the division ratio (1/N) can be selected in accordance with the reproduction speed control signal HS.

In the structure as described above, when the reproduction speed is increased based on the reproduction speed control signal HS described above, operation of the PLL circuit 5 follows the increase of the frequency of the EFM signal and the frequency of the first clock signal PLCK1 increases. Accordingly, the frequency of the second clock signal PLCK2 increases. Therefore, the frequency of the clock signal CK supplied to the up/down counter 13 increases so that the count result changes faster and faster and the gain of the up/down counter 13 increases. Therefore, the open loop gain increases in the feed-back loop constituted by the comparator 11, the up/down counter 13, and the D/A converter 14, so that the frequency range is widened. Inversely, as the reproduction speed is decreased, the frequency of the second clock signal PLCK2 is lowered so that the frequency range in the feed-back loop is narrowed.

Specifically, in the data slice circuit 4, the open loop gain of the feed-back loop described above changes in accordance with the reproduction velocity.

Thus, the data slice circuit 4 is capable of maintaining an optimal frequency range in compliance with the reproduction speed. The feed-back loop of the data slice circuit consisting of the comparator 11, the up/down counter 13, and the D/A converter 14 is not synchronized with the first clock signal PLCK1, so that range design can be easily achieved by the data slice circuit itself.

Meanwhile, the data processing circuit 6 separates a synchronization signal from the EFM signal, and thereafter performs EFM-demodulation, to separates the EFM signal into a sub-code data component and a data component of 32 symbols including parity symbol P and parity symbol Q. Subsequently, the data thus EFM-demodulated is written into a memory (not shown) in synchronization with the first clock signal PLCK1 generated by the PLL circuit 5. Also, the data read out from the memory is subjected to error correction, and thereafter, is outputted as 16-bit digital data from the data processing circuit 6.

Conventional disk reproduction apparatuses are divided into two types. In one type, a PLL clock signal generated from the PLL circuit is used when the data processing circuit writes data into a memory (RAM), and a quartz-based reference clock signal is used when data is read from the memory. In the other type, the PLL clock signal is used when data is read from the memory. In the former type, in case of a variable reproduction speed, data cannot be reproduced stably in a period until the linear speed reaches a regulated speed, and therefore, reproduction is stopped. In contrast, the latter type is a modification of the former type, and the PLL clock signal is synchronized with the reproduction speed. Therefore, data can be reproduced at the time point when the pickup moves from the inner circumference to the outer circumference, and therefore, data can be outputted securely. Consequently, the time required until outputting of data is restarted after access can be shortened than that required in the former type. In addition, the data slice circuit of the latter type controls the control range of the reference voltage in accordance with the PLL clock signal, so that an optimal frequency control rage can be maintained in compliance with the reproduction speed.

Figure 3:
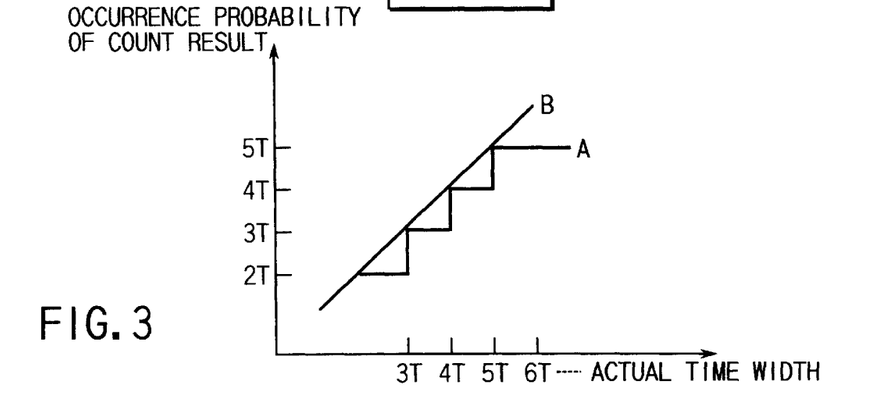
FIG. 3 is a characteristic graph showing an actual time-dependency of an EFM signal of the occurrence probability of count results from an up/down counter of a disk reproduction apparatus according to the present invention.

As described above, the clock signal is synchronized with the reproduction speed in the latter type (synchronized clock), while the clock signal is not synchronized with the reproduction speed in the former type (non-synchronized clock). In case of the synchronized clock, resolution is limited by a resolution due to a clock width, and there is no problem concerning resolution as long as the clock frequency is sufficiently higher than the frequency of the EFM signal. However, as the reproduction speed is increased highly, it is not possible to maintain the relationship that the clock frequency should be sufficiently higher than the frequency of the EFM signal. In case of a non-synchronized clock, the problem concerning the resolution does not occur although the range does not follow the reproduction rate. This is because the occurrence probability of the count result of the up/down counter increases step by step as the time width of the EFM signal increases (characteristic A) in case of a synchronized clock as shown in FIG. 3, while the occurrence probability of the count result is proportional to an actual time width (characteristic B). Specifically, there is no limitations due to resolution in case of a non-synchronized clock. In FIG. 3, the longitudinal axis represents the occurrence probability of the count result and the lateral axis represents an actual time width of the EFM signal.

The present invention is characterized in that the count result is equalized with the actual time width of the EFM signal while using a PLL clock signal so as to make the occurrence probability of the count result correspond to the actual time width.

Figure 4:
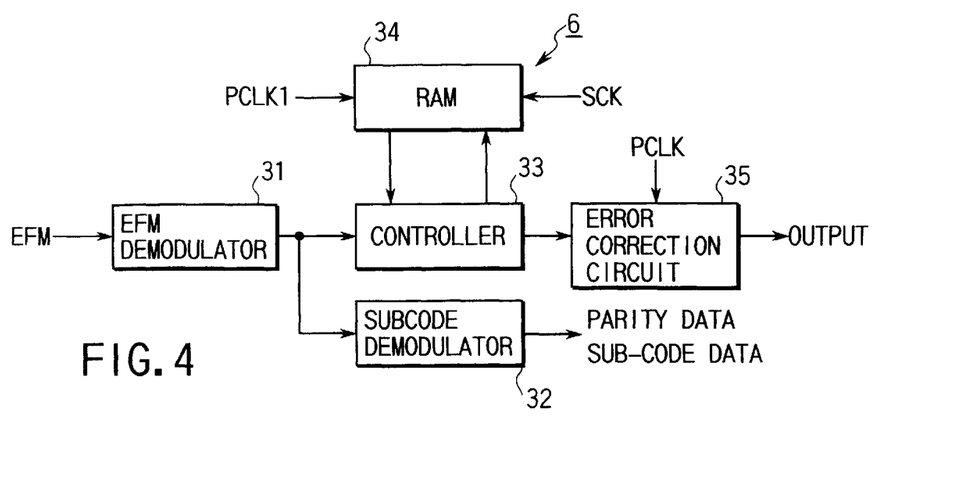
FIG. 4 is a block diagram showing the specific structure of a data processing circuit of the disk reproduction apparatus shown in FIG. 2.

The data processing circuit 6 shown in FIG. 1 and FIG. 2 is constructed, for example, as shown in FIG. 4. The EFM signal outputted from the data slice circuit 4 is supplied to the EFM demodulator 31 and is demodulated therein. Output data from the EFM demodulator 31 is supplied to the sub-code demodulator 32 and the controller 33. The sub-code demodulator 32 separates sub-code data and data of 32 symbols including parity symbol P and parity symbol Q, from the output data from the EFM demodulator 31. A controller 33 is connected to a memory (RAM) 34. The memory 34 is supplied with the first clock signal PLCK1 as a synchronization clock signal used for writing data and is also supplied with a system clock signal SCK having stable frequency as a synchronization signal used for reading data. Further, the controller 33 writes output data from the EFM demodulator 31 into the memory 34, in synchronization with the clock signal PLCK1 described above. Also, the controller 33 reads the data written in the memory 34, in synchronization with the system clock signal SCK. In this manner, change of time axis due to a motor is absorbed.

The data thus read from the memory 34 is supplied to an error correction circuit 35. The error correction circuit 35 performs C1-sequence and C2-sequence error correction processing, based on the parity symbol P and parity symbol Q.

In the next, a second embodiment will be explained with reference to FIG. 5.

Figure 5:
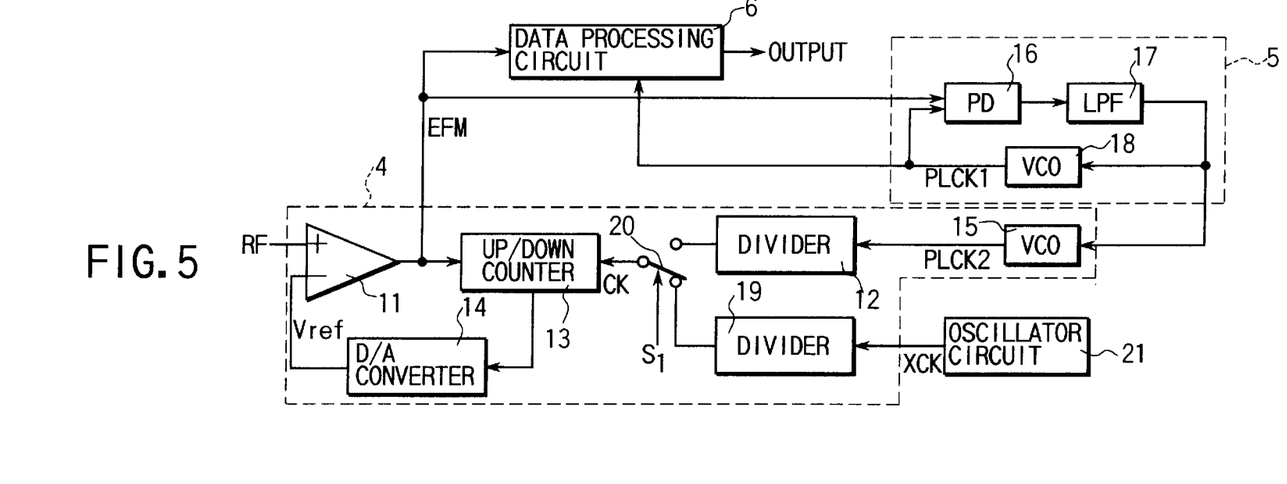
FIG. 5 is a block diagram showing the structure of a main part of a disk reproduction apparatus according to a second embodiment of the present invention.

The disk reproduction apparatus shown in FIG. 5 is added with a divider 19 and a switch circuit 20 in the data slice circuit 4. The divider 19 is supplied with a clock signal XCK having a stable frequency generated by an oscillator circuit 21 using a quartz oscillator. The divider 19 divides the clock signal XCK. The switch circuit 20 is connected between an input of the up/down counter 13 and outputs of two dividers 12 and 19. The switch circuit 20 selects one of the outputs of the two dividers 12 and 19, based on a selection signal S1, and outputs the selected one of the outputs, as a clock signal CK for counting to the up/down counter 13.

Specifically, the data slice circuit 4 used in this embodiment comprises a comparator 11, first and second dividers 12 and 19, a switch circuit 20, an up/down counter 13, and a digital/analog converter 14. The comparator 11 compares a RF signal supplied from the amplifier 3 with a reference voltage Vref. Each of the first and second dividers 12 and 19 divides a clock signal to generate a clock signal CK for counting. The switch circuit 20 selects and outputs any of the outputs of the dividers 12 and 19. The up/down counter 13 counts the clock signal CK for counting, outputted from the comparator 11, in correspondence with the period of data "1" and the period of data "1" supplied from the comparator 11, and outputs differential data therebetween. The digital/analog converter 14 is supplied with the differential data outputted from the up/down counter 13, converts the differential data into an analog voltage, and supplies the analog voltage as a reference voltage Vref to the comparator 11.

The first divider 12 divides a PLL clock signal PLCK2 generated from a voltage controlled oscillator 15 as described above, by N, to generate a first clock signal for counting (e.g., an integration reference signal). The second divider 19 divides a clock signal XCK having a stable frequency and generated from an oscillator circuit 21 using a quartz oscillator, by M, to generate a second clock signal CK having a fixed frequency for counting (e.g., an integration reference signal). The switch circuit 20 selects one of the clock signal for counting, outputted from the first divider 12, and the clock signal for counting, outputted from the second divider 19, and supplies the selected clock signal to the up/down counter 13.

A selection signal S1 for controlling selection operation in the switch circuit 20 is generated by a control circuit not shown in correspondence with the locked/unlocked state of the PLL circuit 5. Specifically, in case where the PLL circuit 5 is locked, a PLL clock signal outputted from the first divider 12 is set to such a level that is selected by the switch circuit 20. In case where the PLL circuit is not locked, the quartz-based clock signal outputted from the second divider 19 is set to such a level that is selected by the switch circuit 20. The oscillation frequency in the oscillator circuit 21 is set to a frequency with which the control range is optimized when the reproduction speed of the disk is at the center of its variation range. Therefore, even if the frequency extraction operation is delayed due to some factor in the PLL circuit 5, it is possible to prevent the control range of the data slice circuit 4 from being greatly shifted from an optimal value. Note that the level change of the selection signal S1 for controlling the switch circuit 20 may be carried out at a position where the PLL circuit 5 is shifted perfectly from a locked state or slightly from an unlocked state.

Figure 6:
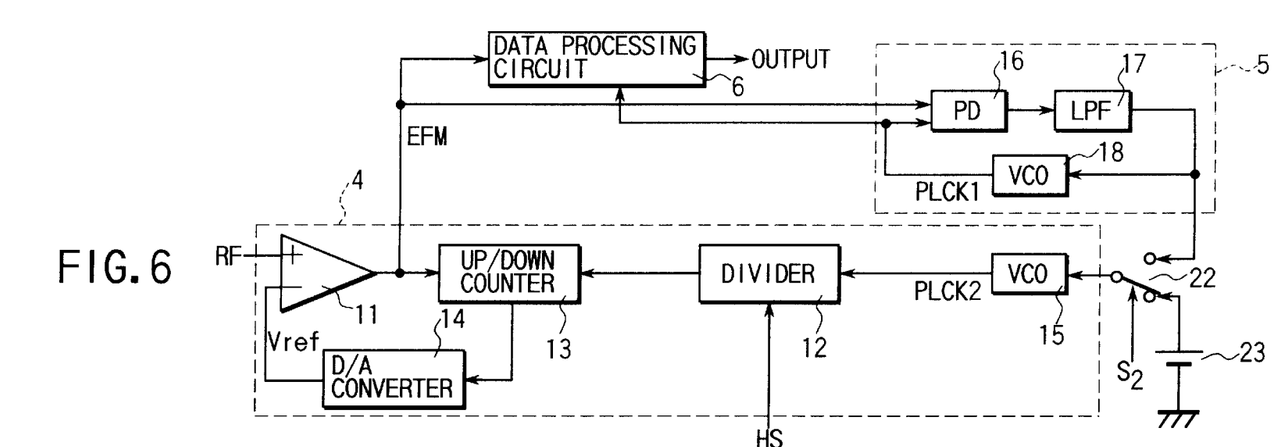
FIG. 6 is a block diagram showing the structure of a main part of a disk reproduction apparatus according to a third embodiment of the present invention.

Next, a third embodiment will be explained with reference to FIG. 6.

In the disk reproduction apparatus shown in FIG. 2, the frequency control signal generated by the PLL circuit 5 is directly supplied to the voltage controlled oscillator 15. However, the disk reproduction apparatus according to the present embodiment is characterized in that a switch circuit 22 is provided between the PLL circuit 5 and the voltage controlled oscillator 15. The switch circuit 22 selects one of a frequency control signal outputted from the PLL circuit 5 and a frequency control signal outputted from the reference voltage source 23 in correspondence with a selection signal S2, and supplies the selected signal to the voltage controlled oscillator 15.

The switch circuit 22 selects one of the frequency control signal outputted from the PLL circuit 5 and the frequency control signal outputted from the reference voltage source 23, in correspondence with the locked/unlocked state of the PLL circuit 5. Specifically, in accordance with the selection signal S2, the switch circuit 22 selects the frequency control signal when the PLL circuit 5 is locked, and selects the frequency control signal outputted from the reference voltage source 23 when the PLL circuit 5 is unlocked. Therefore, if the extraction operation for the frequency in the PLL circuit 5 is delayed due to some factor, it is possible to prevent the control range of the data slice circuit 4 from greatly shifted from an optimal value.

Figure 7:
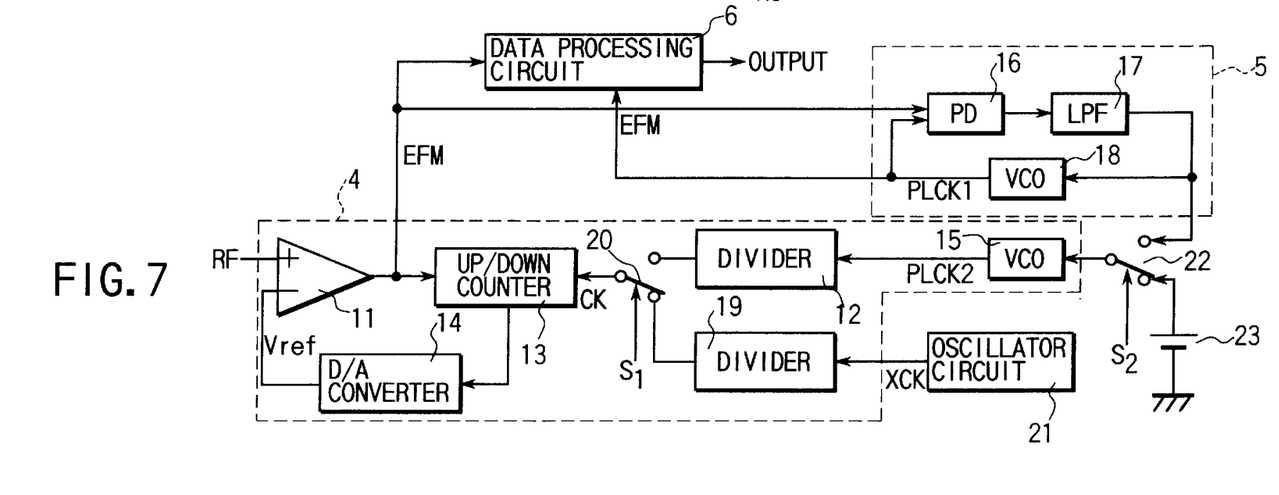
FIG. 7 is a block diagram showing the structure of a main part of a disk reproduction apparatus according to a fourth embodiment of the present invention.

Note that the present invention is not limited to the embodiments described above but may naturally be modified variously without deviating from the scope of the subject matter of the invention. For example, as shown in the embodiment of FIG. 7, the divider 19 and the switch circuit 20 shown in FIG. 5 and the switch circuit 22 and the reference voltage source 23 shown in FIG. 6 can be used together. Where the present invention is constructed in the structure shown in FIG. 7, the range of selection of clock signals for counting is widened.

According to the structure of the present invention constructed as described above, the clock signal used in the data slice circuit sequentially follows the reproduction speed of the EFM signal in the aspect of the frequency, and the phase is not synchronized with the EFM signal. It is therefore possible to prevent the reproduction ability from being changed due to the reproduction speed, and the range design of the data slice circuit can be carried out solely with ease. In addition, even if the frequency extraction operation in the PLL circuit is delayed due to some factor, it is possible to prevent the control range of the data slice circuit from being greatly shifted from an optimal value.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A disk reproduction apparatus comprising:
    a photoelectric transducer for optically reading data recorded on a disk and for converting said data into an electric signal;
    an amplifier for amplifying said electric signal supplied from said photoelectric transducer;
    a data slice circuit for binarizing said electric signal supplied from said amplifier, to generate a modulated signal;
    a PLL circuit for generating a first clock signal and a frequency control signal in accordance with a change of a reproduction speed of data, based on said modulated signal supplied from said data slice circuit; and
    a data processing circuit for demodulating said modulated signal supplied from said data slice circuit, based on said first clock signal supplied from said PLL circuit, to reproduce data, wherein
    said data slice circuit includes
        a clock signal generator circuit for generating a second clock signal not synchronized with said modulated signal, based on said frequency control signal generated by said PLL circuit,
        a comparator for comparing said electric signal supplied from said amplifier with a reference voltage, to output one of data items "0" and "1", in correspondence with said electric signal and said reference voltage,
        a first divider for dividing said second clock signal, to generate a first integration reference clock signal,
        a differential data calculator for integrating a differential value between a period of said data item "0" and a period of said data item "1" supplied from said comparator, based on said first integration reference clock signal, and outputs a differential data, and
        a digital/analog converter supplied with said differential data outputted from said differential data calculator, for converting said differential data into an analog voltage, and for supplying said analog voltage as said reference voltage to said comparator.

2. An apparatus according to claim 1, further comprising:
    a second divider for dividing a clock signal of a constant frequency, to generate a second integration reference clock signal; and
    a first switch circuit inputted with said first integration reference clock signal generated by said first divider and with said second integration reference clock signal generated by said second divider, for selecting and outputting one of said first and second integration reference clock signals, as an integration reference clock signal, to said differential data calculator, based on a first selection control signal.

3. An apparatus according to claim 1, further comprising a second switch circuit inputted with said frequency control signal generated by said PLL circuit and a reference frequency control signal, for selecting and outputting one of said frequency control signal and said reference frequency control signal, to said clock signal generator circuit, based on a second selection control signal.

4. An apparatus according to claim 1, further comprising:
   a first switch circuit inputted with said frequency control signal generated by said PLL circuit and a reference frequency control signal, for selecting and outputting one of said frequency control signal and said reference frequency control signal, to said clock signal generator circuit, based on a first selection control signal;
   a second divider for dividing a clock signal of a constant frequency, to generate a second integration reference clock signal; and
   a second switch circuit inputted with said first integration reference clock signal generated by said first divider and with said second integration reference clock signal generated by said second divider, for selecting and outputting one of said first and second integration reference clock signals, as an integration reference clock signal, to said differential data calculator, based on a second selection control signal.

5. An apparatus according to claim 1, wherein said data processing circuit includes:
   a first demodulator for demodulating said modulated signal supplied from said data slice circuit;
   a memory for storing output data from said first demodulator;
   a controller for writing said output data from said first demodulator into said memory, in response to said first clock signal generated by said PLL circuit, and for reading said data written in said memory, in response to a clock signal of a constant frequency; and
   an error correction circuit for correcting an error in said data read by said controller.

6. An apparatus according to claim 1, wherein said PLL circuit includes:
   a phase comparator for receiving said modulated signal and said first clock signal, and for generating a signal corresponding to a phase difference between said modulated signal and said first clock signal;
   a low-pass filter circuit for receiving an output from said phase comparator; and
   a first voltage controlled oscillator for generating an output whose output frequency is changed in accordance with an output from said low-pass filter circuit, and for supplying said output thereof as said first clock signal to said phase comparator.

7. An apparatus according to claim 6, wherein said clock signal generator circuit is a second voltage controlled oscillator whose output frequency is changed in accordance with said frequency control signal.

8. An apparatus according to claim 1, wherein said differential data calculator is a counter which counts said first integration reference clock signal supplied from said first divider, as a clock signal to be counted, in correspondence with said periods of said data items "0" and "1" supplied from said comparator.

9. An apparatus according to claim 1, wherein said differential data calculator is an up/down counter for counting up or down said first integration reference clock signal supplied from said first divider, as a clock signal to be counted, in correspondence with said periods of said data items "0" and "1" supplied from said comparator.

10. An apparatus according to claim 1, wherein said first divider is a programmable divider whose division ratio is selected in accordance with a reproduction speed control signal.

11. An apparatus according to claim 1, wherein said comparator, said differential data calculator, and said digital/analog converter constitute a feed-back loop in said data slice circuit, and an open loop gain of said feed-back loop changes in accordance with a reproduction velocity.

12. A signal processing circuit used for reading disk data from a disk and for converting the disk data into an amplified electric signal, comprising:
   a data slice circuit for binarizing said amplified electric signal, to generate a modulated signal; and
   a PLL circuit for generating a PLL clock signal and a frequency control signal in accordance with a change of a reproduction speed of data, based on said modulated signal supplied from said data slice circuit, wherein
   said data slice circuit includes
      a clock signal generator circuit for generating a clock signal not synchronized with said modulated signal, based on said frequency control signal generated by said PLL circuit,
      a comparator for comparing said amplified electric signal with a reference voltage, to output one of data items "0" and "1", in correspondence with said amplified electric signal and said reference voltage,
      a first divider for dividing said clock signal, to generate a first integration reference clock signal,
      a differential data calculator for integrating a differential value between a period of said data item "0" and period of said data item "1" supplied from said comparator, based on said first integration reference clock signal, and outputs a differential data, and
      a digital/analog converter supplied with said differential data outputted from said differential data calculator, for converting said differential data into an analog voltage, and for supplying said analog voltage as said reference voltage to said comparator, so that said data slice circuit binarizes said amplified electric signal, in accordance with a change of a reproduction speed of the data.

13. A circuit according to claim 12, further comprising:
   a second divider for dividing a clock signal of a constant frequency, to generate a second integration reference clock signal; and
   a first switch circuit inputted with said first integration reference clock signal generated by said first divider and with said second integration reference clock signal generated by said second divider, for selecting and outputting one of said first and second integration reference clock signals, as an integration reference clock signal, to said differential data calculator, based on a first selection control signal.

14. A circuit according to claim 12, further comprising a second switch circuit inputted with said frequency control signal generated by said PLL circuit and a reference frequency control signal, for selecting and outputting one of said frequency control signal and said reference frequency control signal, to said clock signal generator circuit, based on a second selection control signal.

15. A circuit according to claim 12, further comprising:
   a first switch circuit inputted with said frequency control signal generated by said PLL circuit and a reference frequency control signal, for selecting and outputting one of said frequency control signal and said reference frequency control signal, to said clock signal generator circuit, based on a first selection control signal;
   a second divider for dividing a clock signal of a constant frequency, to generate a second integration reference clock signal; and a second switch circuit inputted with said first integration reference clock signal generated by said first divider and with said second integration reference clock signal generated by said second divider, for selecting and outputting one of said first and second integration reference clock signals, as an integration reference clock signal, to said differential data calculator, based on a second selection control signal.

16. A circuit according to claim 12, wherein said PLL circuit includes:
   a phase comparator for receiving said modulated signal and said PLL clock signal, and for generating a signal corresponding to a phase difference between said modulated signal and said PLL clock signal;
   a low-pass filter circuit for receiving an output from said phase comparator; and
   a first voltage controlled oscillator for generating an output whose output frequency is changed in accordance with an output from said low-pass filter circuit, and for supplying an output thereof as said PLL clock signal to said phase comparator.

17. A circuit according to claim 16, wherein said clock signal generator circuit is a second voltage controlled oscillator circuit whose output frequency is changed in accordance with said frequency control signal.

18. A circuit according to claim 12, wherein said differential data calculator is a counter which counts said first integration reference clock signal supplied from said first divider, as a clock signal to be counted, in correspondence with said periods of said data items "0" and "1" supplied from said comparator.

19. A circuit according to claim 12, wherein said differential data calculator is an up/down counter for counting up or down said first integration reference clock signal supplied from said first divider, as a clock signal to be counted, in correspondence with said periods of said data items "0" and "1" supplied from said comparator.

20. A circuit according to claim 12, wherein said first divider is a programmable divider whose division ratio is selected in accordance with a reproduction speed control signal.

* * * * *